US008667372B2

(12) United States Patent
Honda

(10) Patent No.: US 8,667,372 B2
(45) Date of Patent: Mar. 4, 2014

(54) MEMORY CONTROLLER AND METHOD OF CONTROLLING MEMORY

(75) Inventor: Yasufumi Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1535 days.

(21) Appl. No.: 11/790,669

(22) Filed: Apr. 26, 2007

(65) Prior Publication Data

US 2008/0046802 A1 Feb. 21, 2008

(30) Foreign Application Priority Data

Aug. 18, 2006 (JP) ................................. 2006-223489

(51) Int. Cl.
*G11C 29/00* (2006.01)
*H03M 13/03* (2006.01)

(52) U.S. Cl.
USPC .......................................... 714/773; 714/774

(58) Field of Classification Search
USPC ................................................. 714/773, 774
See application file for complete search history.

(56) References Cited

U.S. PATENT DOCUMENTS

| | | | | |
|---|---|---|---|---|
| 4,460,998 A * | 7/1984 | Yamada et al. | ................ | 714/711 |
| 4,573,154 A * | 2/1986 | Nakata et al. | ................ | 714/750 |
| 5,058,115 A * | 10/1991 | Blake et al. | ................ | 714/767 |
| 5,164,944 A * | 11/1992 | Benton et al. | ................ | 714/765 |
| 5,537,428 A * | 7/1996 | Larsson et al. | ................ | 714/758 |
| 5,768,294 A | 6/1998 | Chen et al. | | |
| 5,905,858 A * | 5/1999 | Jeddeloh | ................ | 714/52 |
| 5,978,953 A * | 11/1999 | Olarig | ................ | 714/768 |
| 6,085,339 A * | 7/2000 | Jeddeloh | ................ | 714/52 |
| 6,363,502 B1 * | 3/2002 | Jeddeloh | ................ | 714/52 |
| 6,408,195 B1 * | 6/2002 | Hishiki et al. | ................ | 455/574 |
| 7,185,246 B2 * | 2/2007 | Cochran et al. | ................ | 714/718 |
| 7,203,890 B1 * | 4/2007 | Normoyle | ................ | 714/768 |
| 7,275,189 B2 * | 9/2007 | Ruckerbauer et al. | ........ | 714/723 |
| 7,418,549 B2 * | 8/2008 | Abe | ................ | 711/114 |
| 7,535,780 B2 * | 5/2009 | Lee | ................ | 365/200 |
| 2006/0077750 A1 * | 4/2006 | Pescatore | ................ | 365/232 |

FOREIGN PATENT DOCUMENTS

| | | |
|---|---|---|
| EP | 0 262 452 | 4/1988 |
| GB | 2 220 091 | 12/1989 |
| JP | 55-157043 | 12/1980 |
| JP | 58-127242 | 7/1983 |
| JP | 60-008962 | 1/1985 |
| JP | 7-160587 | 6/1995 |
| JP | 2003-337758 | 11/2003 |

OTHER PUBLICATIONS

Extended European Search Report issued in corresponding European Patent Application No. 07106725.0, on Aug. 20, 2007.
Korean Office Action (mailed May 16, 2008).

* cited by examiner

*Primary Examiner* — Joseph D Torres
(74) *Attorney, Agent, or Firm* — Fujitsu Patent Center

(57) ABSTRACT

An estimating unit estimates, when there is a request for data in a system in which an error checking unit of data is formed with a plurality of memories each of which is a dual memory having an independent address line, whether an error has occurred on the address line based on a result of an error checking for data related to the request. A control unit generates, when it is estimated that an error has occurred on the address line, error data of the data related to the request, and controls the memory in such a manner that one line of the dual memory is disabled by switching the data related to the request to generated error data.

11 Claims, 11 Drawing Sheets

FIG.6

| | TRESHOLD TABLE | |
|---|---|---|
| | FREQUENCY OF UNCOLLECTABLE ERROR | CHANGE DATA |
| 1 | DISABLE (OPSR=0) | NOT PERFORM |
| 2 | FOUR TIMES (OPSR=1) | PERFORM |
| 3 | THREE TIMES (OPSR=2) | PERFORM |
| 4 | TWICE (OPSR=3) | PERFORM |

MEMORY CONTROLLER AND METHOD OF CONTROLLING MEMORY

CROSS REFERENCE TO RELATED APPLICATIONS

This application is based on Japanese Application No. 2006-223489, filed on Aug. 18, 2006, the disclosure of which is hereby incorporated herein by reference.

BACKGROUND OF THE INVENTION

1. Field of the Invention

This invention relates to a technology for controlling a memory in a dual memory system.

2. Description of the Related Art

A technology is conventionally disclosed that enhances reliability in a data processing device and the like by employing a redundant memory system that uses, for example, a DIMM (Dual Inline Memory Module) in a data processing device.

For example, in Japanese Patent Application Laid-Open No. H7-160587, a technology is disclosed that enhances reliability in a redundant memory system by managing trouble information in an address unit at the time of an initial diagnosis of a redundant memory system and, even when a fixing trouble of equal to or more than 2 bits is detected at one line of redundant memory, performing changing to the other line to efficiently utilize a capability of recovering. More specifically, when a fixing trouble of equal to or more than 2 bits is detected at one half of redundant memory at the time of an initial diagnosis, reliability of a redundant memory system is improved by indicating only an address of the corresponding memory as invalid or valid, outputting an invalid signal concerning the address to disable a comparison circuit, and indicating that an address is valid and use of data in memory that has an address in which a parity error is not detected.

However, the above conventional technology has a problem that trouble information cannot be handled in real time and a system down may occur.

That is, the above conventional technology is a technology to enhance reliability in a redundant memory system based on trouble information in initial diagnosis of a redundant memory system. Thus, the technology has a problem that it is impossible to deal with trouble information that is informed in activating a system.

An error on an address line of a DIMM that is a redundant memory system is not supported in the above conventional technology. Therefore, when an error occurs on an address line, it cannot be recognized and then it is even hazardous to use data of a wrong address. In a technology of constituting one ECC (Error Correcting Code) error check unit through a plurality of DIMMs (for example, two DIMMs) to avoid the hazard, there is a possibility that coincidence of ECCs that occurs at a certain probability causes error data. Occurrence of error data through accidental coincidence of ECCs, when a line of redundant memory is changed to recover an error, makes it difficult to determine which line to select, thereby causing a problem that a system down may occur.

SUMMARY OF THE INVENTION

It is an object of the present invention to at least partially solve the problems in the conventional technology.

A memory controller according to one aspect of the present invention controls a memory in a system in which an error checking unit of data is formed with a plurality of memories each of which is a dual memory having an independent address line. The memory controller includes an estimating unit that estimates, when there is a request for data in the system, whether an error has occurred on the address line based on a result of an error checking for data related to the request; and a control unit that generates, when it is estimated that an error has occurred on the address line, error data of the data related to the request, and controls the memory in such a manner that one line of the dual memory is disabled by switching the data related to the request to generated error data.

A method according to another aspect of the present invention is for controlling a memory in a system in which an error checking unit of data is formed with a plurality of memories each of which is a dual memory having an independent address line. The method includes estimating, when there is a request for data in the system, whether an error has occurred on the address line based on a result of an error checking for data related to the request; generating, when it is estimated that an error has occurred on the address line, error data of the data related to the request; and controlling the memory in such a manner that one line of the dual memory is disabled by switching the data related to the request to generated error data.

A computer-readable recording medium according to still another aspect of the present invention stores therein a computer program for controlling a memory in a system in which an error checking unit of data is formed with a plurality of memories each of which is a dual memory having an independent address line. The computer program causes a computer to execute estimating, when there is a request for data in the system, whether an error has occurred on the address line based on a result of an error checking for data related to the request; generating, when it is estimated that an error has occurred on the address line, error data of the data related to the request; and controlling the memory in such a manner that one line of the dual memory is disabled by switching the data related to the request to generated error data.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 6 is an example of a threshold table;

DETAILED DESCRIPTION OF THE PREFERRED EMBODIMENTS

Exemplary embodiments of the present invention will be explained in detail below with reference to the accompanying drawings.

Figure 1:
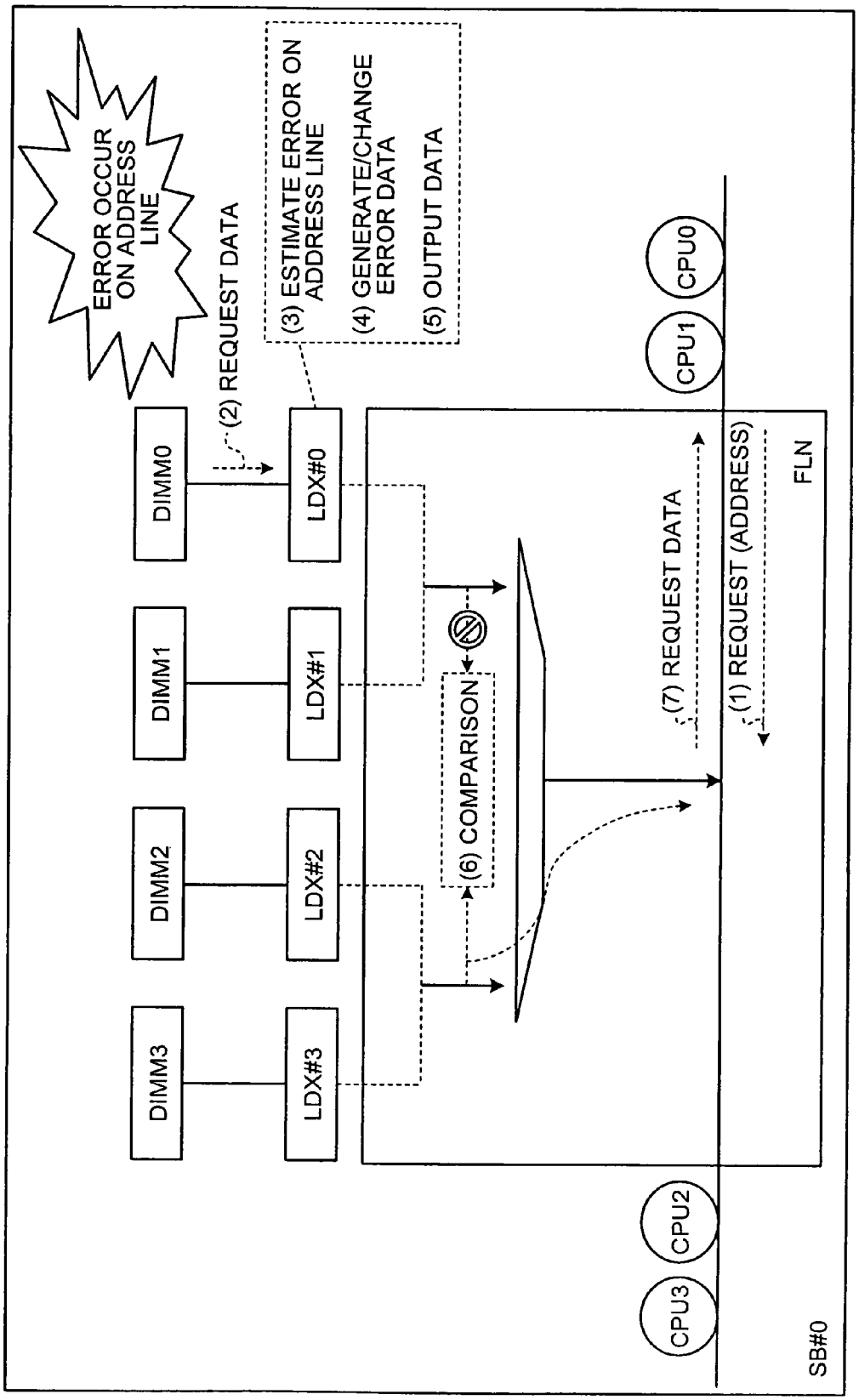
FIG. 1 is a schematic for explaining an outline and a characteristic of a memory controller according to a first embodiment of the present invention.

FIG. 1 is a schematic for explaining the outline and characteristic of the memory controller according to a first embodiment of the present invention.

The memory controller according to the first embodiment has the outline that an error checking unit of data is constituted of a plurality of memories each of which has an address line and the controller controls memory in a redundant memory system (mirror) and the characteristic that it is possible to prevent a system down by dealing with trouble information in real time and estimating an error on an address line.

As shown in FIG. 1, in the system to which the memory controller (LDX#0 to #3) according to the first embodiment is applied, an LDX#1 connected to a DIMM1, an LDX#0 connected to a DIMM0, and an LDX#3 connected to a DIMM3, and an LDX#2 connected to a DIMM2 constitute a mirror, the DIMM1 and the DIMM0 constitute a data unit, and the LDX#1 connected to the DIMM1 and the LDX#0 connected to the DIMM0 constitute an ECC check unit that is an error checking unit.

When an address and request data are output from a CPU1 in an SB#0 (system board) (see (1) shown in FIG. 1), a part of request data is output from the DIMM0 that causes an address line error to the LDX#0 (see (2) shown in FIG. 1), for example, the rest of request data is output from the DIMM1 to the LDX#1.

The LDX#1 and the LDX#0 exchange ECC information that each of them has (information for ECC check) to perform ECC check, perform ECC checking with regard to a part of request data respectively, and estimate whether an error occurs on an address line (see (3) shown in FIG. 1). More specifically, for example, the LDX#0 creates a syndrome (diagnosis information) that is a result of ECC check about a part of request data and estimates that an error occurs on an address line based on a condition of the error about a part of request data obtained from the syndrome, for example, when most of request data causes an uncorrectable error. When the LDX#0 estimates that an error occurs on an address line, the LDX#1 also estimates that an error occurs on an address line.

When it is estimated that an error occurs on an address line, the LDX#1 and the LDX#0 create error data with regard to a part of request data that each of them manages, and switch a part of request data to error data that each of them generates (see (4) shown in FIG. 1). The LDX#1 and the LDX#0 output the switched error data to an FLN (comparison circuit) to control not to use data recorded in the DIMM1 and the DIMM0 that constitute one line of a mirror (see (5) shown in FIG. 1).

When the FLN compares request data that is input from the LDX#3 and the LDX#2 that constitute the other line of the mirror with data input from the LDX#1 and the LDX#0 (see (6) shown in FIG. 1), because the data input from the LDX#1 and the LDX#0 is error data, the data is not employed as targeted comparison. The request data input from the LDX#3 and the LDX#2 is output to the CPU1 from which the data is originally requested (see (7) shown in FIG. 1).

As a result, according to the first embodiment, it is possible to deal with trouble information such as estimated error information of an address line in real time in the redundant memory system (mirror) and, if error data is caused due to an error on an address line, before comparing data in the FLN (comparison circuit) in the redundant memory system (mirror), to switch to generated error data not to compare, enabling prevention of a system down by estimating an error in an address line, as the above-mentioned main characteristic.

Figure 2:
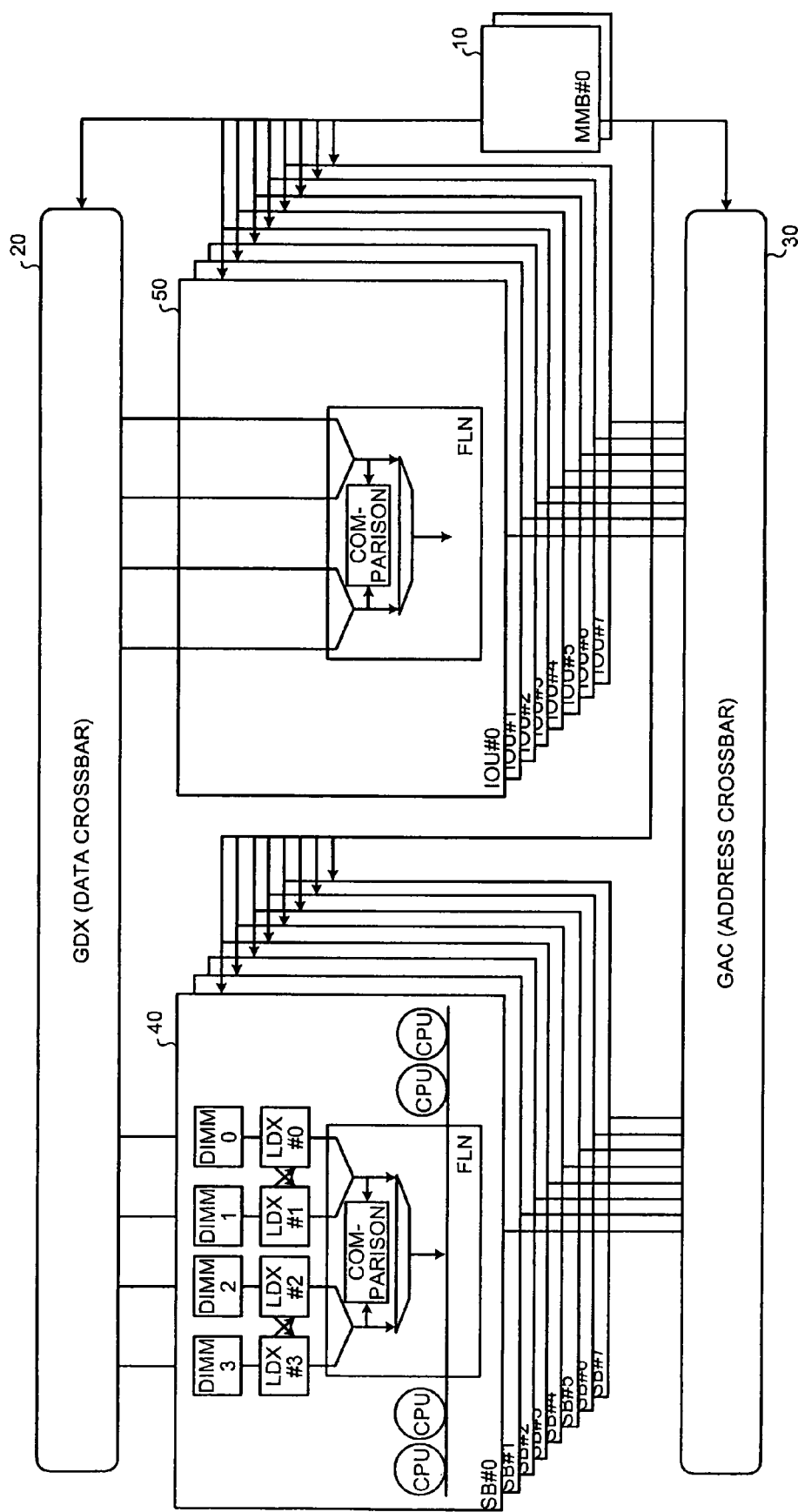
FIG. 2 is a diagram of a configuration of a system to which the memory controller according to the first embodiment is applied.
Figure 3:
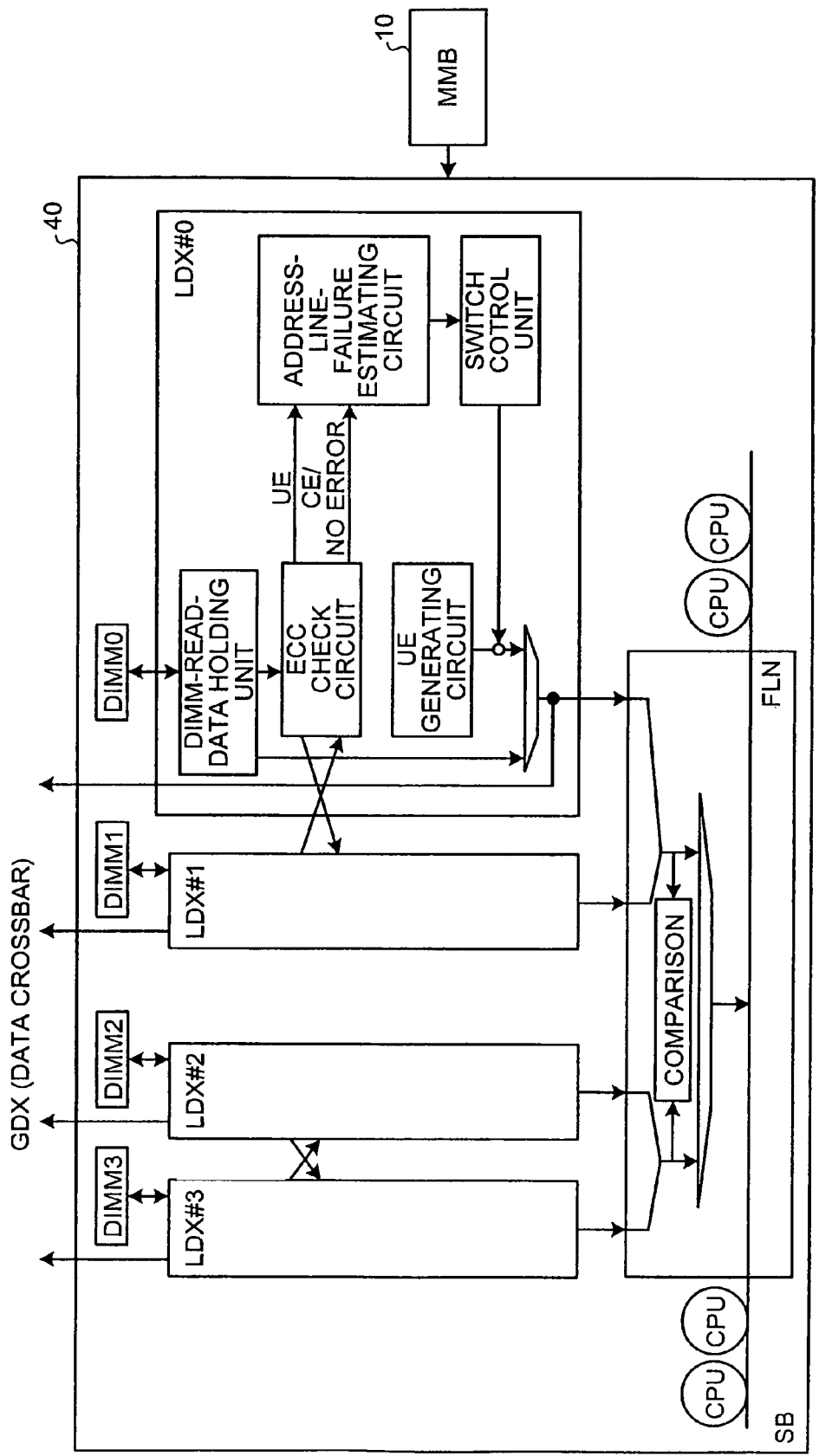
FIG. 3 is a block diagram of a system board and the memory controller according to the first embodiment.

FIG. 2 is a diagram of a configuration of a system to which the memory controller according to the first embodiment is applied. FIG. 3 is a block diagram of the system board and the memory controller according to the first embodiment.

As shown in FIG. 2, the system to which the memory controller according to the first embodiment is applied includes an MMB 10, a GDX (Data Crossbar) 20, a GAC (Address Crossbar) 30, an SB 40, and an IOU (Input/output Unit) 50.

The MMB 10 is a control device that performs various controls about the GDX 20, GAC 30, SB 40, and IOU 50. The GDX 20 is a relay device that communicates data between the SB 40 and the IOU 50. The GAC 30 is a relay device that controls relay of a request input from the SB 40 and the IOU 50 and a request response. The SB 40 in which DIMMs, LDXs, CPUs, and the like are arranged is a board that controls various information processing. The IOU 50 is a board that includes an input output interface of an external device connected from outside.

As shown in FIG. 3, the SB 40 has the LDX#3 connected to the DIMM3 and the LDX#2 connected to the DIMM2, and the LDX#1 connected to the DIMM1 and the LDX#0 connected to the DIMM0 arranged to constitute a mirror and includes the CPU and the FLN arranged therein.

The DIMM is a storing device that stores data and a program necessary for various processing by the CPU. The DIMM3 and the DIMM2, and the DIMM1 and the DIMM0 constitute a data unit respectively. The LDX is a processor that controls the DIMM based on various information input from the DIMM. The CPU is a processor that has an internal memory to store a predetermined control program, a program that prescribes various processing procedures, and required data to execute various processing through them. The FLN is a processor that has a circuit that respectively compares data input from each LDX that constitutes a mirror to output data to the CPU.

The LDX#0 to #3 includes a DIMM-read-data holding unit, an ECC checking circuit, an address-line-failure estimating circuit, a switch control unit, and a UE generating circuit.

The DIMM-read-data holding unit temporarily holds a part of request data read from the DIMM.

The ECC checking circuit checks an error based on an ECC with respect to a part of request data held in the DIMM-read-data holding unit and outputs the resulting checking to an address-line-failure estimating circuit. An ECC check unit in an ECC check circuit of the LDX#3 and an ECC check circuit of the LDX#2 and an ECC check unit in an ECC check circuit of the LDX#1 and an ECC check circuit of the LDX#0 are constituted respectively. The ECC checking circuit that includes an ECC check unit exchanges ECC information (information for ECC checking) to perform error checking based on ECC.

The address-line-failure estimating circuit estimates whether an error occurs on an address line based on the resulting error checking about a part of request data received from the ECC check circuit. More specifically, for example, the LDX#0 creates a syndrome (diagnosis information) that is the resulting ECC checking about a part of request data and estimates that an error occurs on an address line, for example, when most of the request data causes an uncorrectable error, based on a condition of an error about a part of the request data obtained from the syndrome. When it is estimated that an error occurs on an address line, the signal is output to the switch control unit. When the LDX#0 estimates that an error occurs on an address line, the LDX#1 also estimates that an error occurs on an address line.

The switch control unit is a processor that controls a switch of request data to error data. More specifically, when a signal that estimates that an error occurs on an address line is input from the address-line-failure estimating circuit, a signal is output to the UE generating circuit to generate error data with regard to a part of request data and switch to error data that generates a part of request data.

The UE (Uncorrectable Error) generating circuit generates error data that causes an uncorrectable error with regard to request data to switch. More specifically, based on a signal received from the error switch control unit, error data is generated from request data and request data is switched to error data.

The LDX#1 and the LDX#0 output switched error data to the FLN (comparison circuit) to control not to use data recorded in the DIMM1 and the DIMM0 that constitute one line of a mirror. Error data output from the LDX#1 and the LDX#0 respectively is coupled to become error data about request data.

When the FLN compares request data that is received from the LDX#3 and the LDX#2 that constitute the other line of the mirror with data received from the LDX#1 and the LDX#0, because the data received from the LDX#1 and the LDX#0 is error data, the data is not employed as targeted comparison. Request data received from the LDX#3 and the LDX#2 is output where the data is originally requested (for example, CPU).

Figure 4:
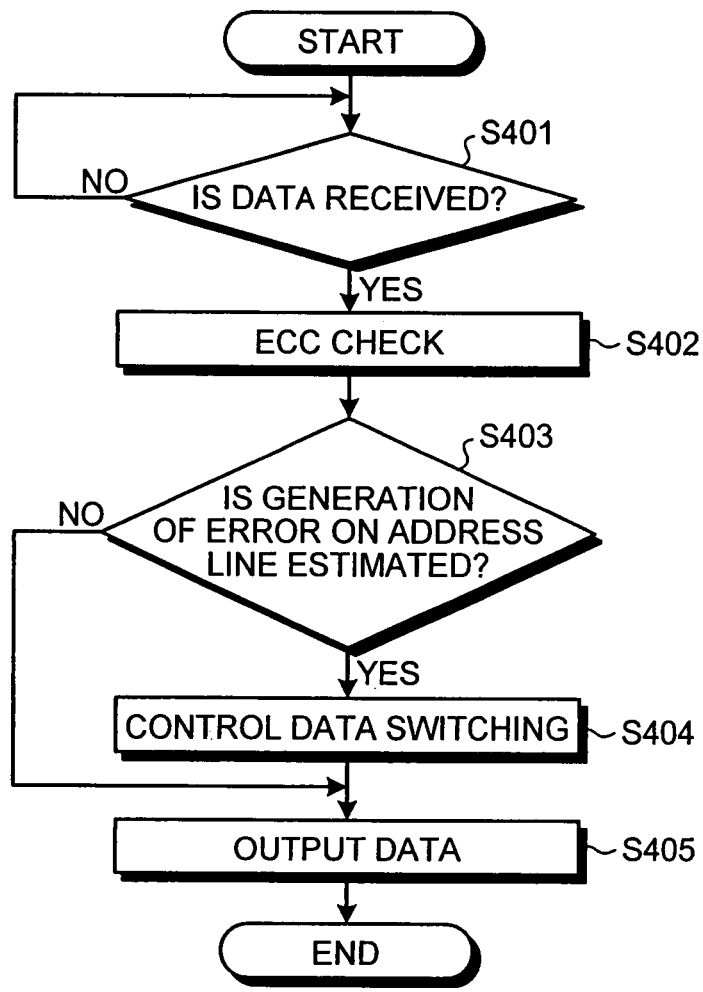
FIG. 4 is a flowchart for explaining processing of the memory controller according to the first embodiment.

FIG. 4 is a flowchart for explaining processing of the memory controller according to the first embodiment. As shown in FIG. 4, for example, when a part of request data read from the DIMM0 is received (yes at step S401), the LDX#0 temporarily holds it at the DIMM-read-data holding unit. The ECC check circuit of the LDX#0 gives an error check, through the ECC, to a part of request data held at the DIMM-read-data holding unit (step S402), the resulting checking is output to the address-line-failure estimating circuit. The ECC check circuit exchanges ECC information (information for checking ECC) with another ECC check circuit that constitutes an ECC check unit to perform error checking through ECC.

The address-line-failure estimating circuit estimates whether an error occurs on an address line based on the resulting error checking about a part of request data input from the ECC check circuit (step S403). More specifically, for example, a syndrome (diagnosis information) that is a resulting ECC checking about a part of request data is created and the address-line-failure estimating circuit estimates that an error occurs on an address line based on a condition of an error about a part of request data obtained from the syndrome, for example when most of the request data causes an uncorrectable error.

When it is estimated that an error occurs on an address line (yes at step S403), the address-line-failure estimating circuit outputs the signal to the switch control unit. The switch control unit controls to switch a part of request data to error data (step S404). More specifically, when a signal that estimates that an error occurs on an address line is input from the address-line-failure estimating circuit, error data about a part of request data is created at the UE generating circuit, and a signal to switch to error data that generates a part of request data is output. On the other hand, the address-line-failure estimating circuit does not particularly output a signal to the switch control unit when the address-line-failure estimating circuit does not estimate that an error occurs on an address line (no at step S403).

The LDX#0 outputs the switched error data to the FLN (comparison circuit) to control not to use data recorded in the DIMM0 that constitutes one line of mirror and the LDX#1 also outputs the switched error data to the FLN (comparison circuit) to control not to use data recorded in DIMM1 (step S405).

As described above, according to the first embodiment, whether an error occurs on an address line (a line that transmits a data address of a request) is estimated based on the result (for example, the result of ECC checking) of error checking of request data that is performed when there is a request in the system. When it is estimated that an error occurs on an address line, error data is created with respect to data of the request to switch the data to error data, thereby controlling not to use data of one line of redundant memory. It is possible to deal with trouble information, in real time, such as information of estimating that an error occurs on an address line in the redundant memory system (mirror) and, if error data is caused due to an error on an address line, to switch to generated error data not to compare before comparing data at the comparison circuit in the redundant memory system (mirror). Thus, estimation of an error on an address line enables prevention of a system down.

Furthermore, according to the first embodiment, it is estimated whether an error occurs on an address line based on the result of error checking that is performed about connected memory. For example, a system configuration of controlling one DIMM by one memory controller has a higher capability than a system configuration of controlling two DIMM by one memory controller. Thus, estimation of an error on an address line enables prevention of a system down.

Estimation of whether an error occurs on an address line is explained based on a condition of an error of request data obtained as the resulting error checking through the ECC check circuit (a degree of how data is damaged) in the first embodiment, however, the present invention is not limited to the first embodiment. The number of times when uncorrectable errors occur is obtained in error checking of request data in the ECC check circuit and whether an error occurs on an address line can be estimated based on the obtained number of times.

Figure 5:
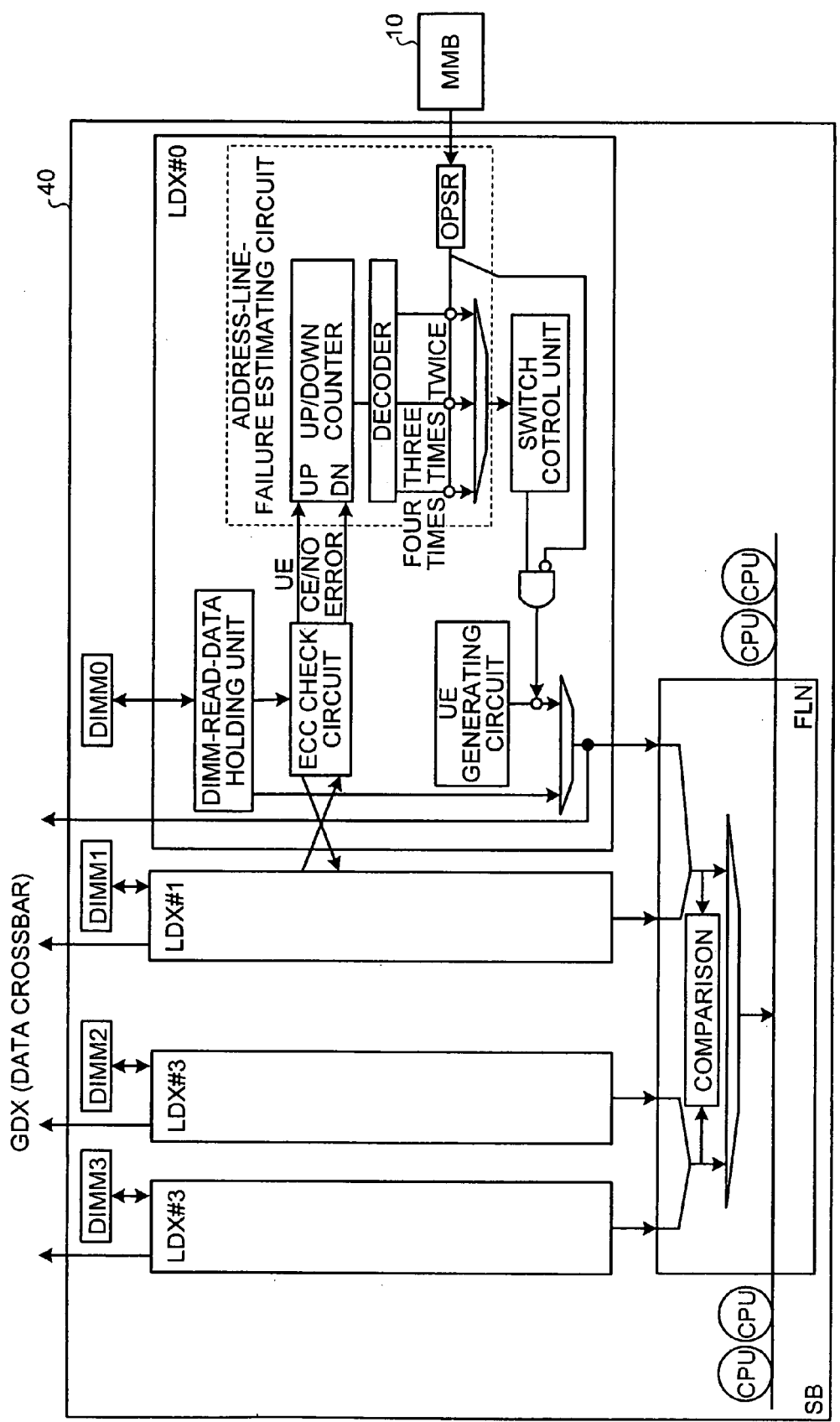
FIG. 5 is a block diagram of a system board and a memory controller according to a second embodiment of the present invention.

FIG. 5 is a block diagram of a system board and a memory controller according to the second embodiment. The configuration of the SB and the memory controller according to the second embodiment is fundamentally the same as the configuration of the SB and the memory controller according to the first embodiment except the following description.

The address-line-failure estimating circuit includes a counter, Decoder, and OPSR. The counter is a device that counts the number of times when uncorrectable errors occur that are detected by error checking of the ECC check circuit. The Decoder outputs a counter value.

The OSPR (operation register) receives setting from the MMB 10, estimates that an error occur on an address line, and specifies the counter value to make the switch control unit switch a part of request data to error data. For example, as shown in FIG. 6, the OSPR has a table to store whether data switching is performed corresponding to the number of times when uncorrectable errors occur to estimate that an error occurs on an address line.

The address-line-failure estimating circuit determines whether the counter value output from the Decoder exceeds the upper-limit number of times designated by the OPSR. As a result, when the counter value exceeds the upper-limit number of times, the address-line-failure estimating circuit outputs a signal to switch the request data to the error data to the switch control unit. The upper-limit number of times can be appropriately altered based on change of setting from the MMB 10.

When the switch control unit receives a signal from the address-line-failure estimating circuit, it controls to switch request data to error data. More specifically, the switch control unit outputs a signal, to the UE generating circuit, to generate error data with respect to a part of request data and switch to error data that generates a part of request data.

The table that the OPSR has (see FIG. 6) is only an example. A table whose structure is appropriately altered can be generated without being limited to the table that the OPSR has. Based on the resulting determination of whether the number of times when errors occur exceeds the upper-limit number of times, without being limited to when it is controlled that a part of request data is switched to error data, for example, when the number of times when errors continuously occur is counted and the number of times when errors continuously occur exceeds the predetermined upper-limit number of times, the address-line-failure estimating circuit estimates that a failure occurs on an address line and can make the switch control unit control to switch a part of request data to error data.

Figure 7:
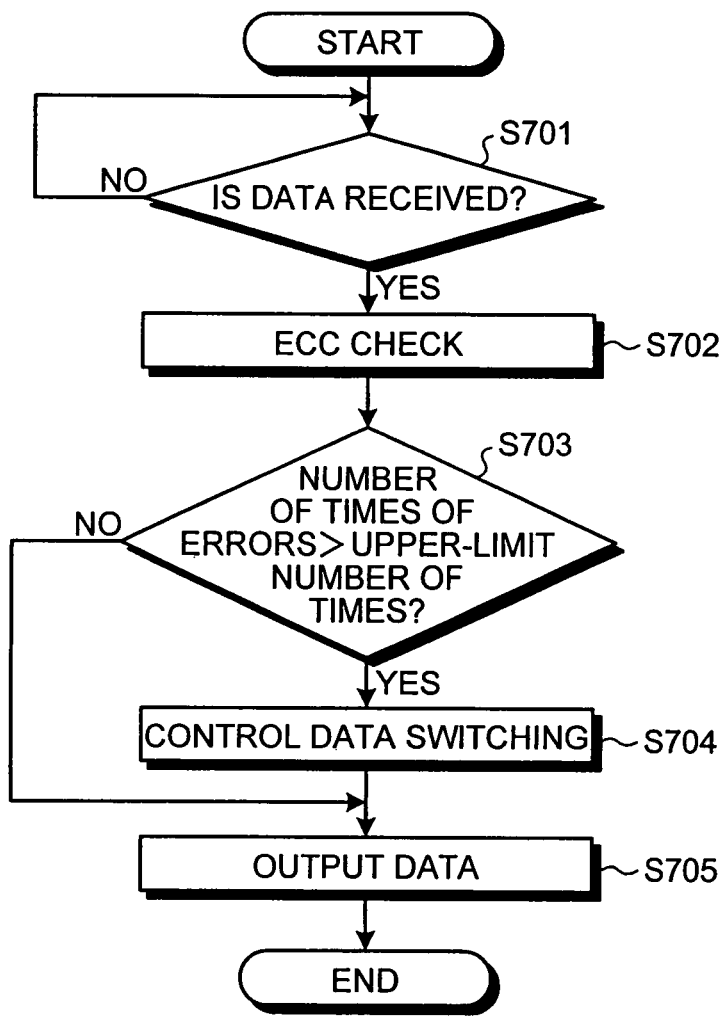
FIG. 7 is a flowchart for explaining processing of the memory controller according to the second embodiment.

FIG. 7 is a flowchart for explaining processing of the memory controller according to the second embodiment. The processing of steps S701, S702, and S705 is the same as processing of steps S401, S402, and S405 that are described in the first embodiment shown in FIG. 4. Thus, processing of steps S703 and S704 is explained below.

As shown in FIG. 7, the address-line-failure estimating circuit estimates whether an error occurs on an address line based on the result of error checking about a part of request data input from the ECC check circuit (step S703). More specifically, whether the counter value output from the Decoder exceeds the upper-limit number of times designated from the OPSR is determined. As a result of the determination, when the counter value exceeds the upper-limit number of times (yes at step S703), the address-line-failure estimating circuit estimates that an error occurs on an address line and outputs a signal to the switch control unit to switch request data to error data. On the other hand, the address-line-failure estimating circuit, when the counter value does not exceed the upper-limit number of times (no at step S703), does not particularly output a signal to the switch control unit.

The switch control unit, when a signal is input from the address-line-failure estimating circuit, controls to switch request data to error data (step S704). More specifically, error data is created with respect to a part of request data and the switch control unit outputs a signal to the UE generating circuit to switch to error data that generates a part of request data.

As described above, according to the second embodiment, when the number of times when uncorrectable errors occur obtained as the resulting error checking is calculated and the number of times when uncorrectable errors occur exceeds the predetermined upper-limit number of times, it is estimated that an error occurs on an address line. Thus, it is possible to estimate an error on an address line by a simple configuration and prevent a system down.

Furthermore, according to the second embodiment, because the predetermined upper-limit number of times to estimate that an error occurs on an address line is altered, for example, a system maintainer arbitrarily sets the upper-limit number of times so that it is possible to prevent a system down.

When it is estimated that an error occur on an address line in the second embodiment, error checking is performed through ECC again. Based on the resulting error rechecking, when it is determined that an error does not occur on an address line, error data can be switched to request data and data of one line of redundant memory can be reused. A configuration and processing of the memory controller according to a third embodiment of the present invention is explained in turn in the following third embodiment and effects of the third embodiment are explained finally.

Figure 8:
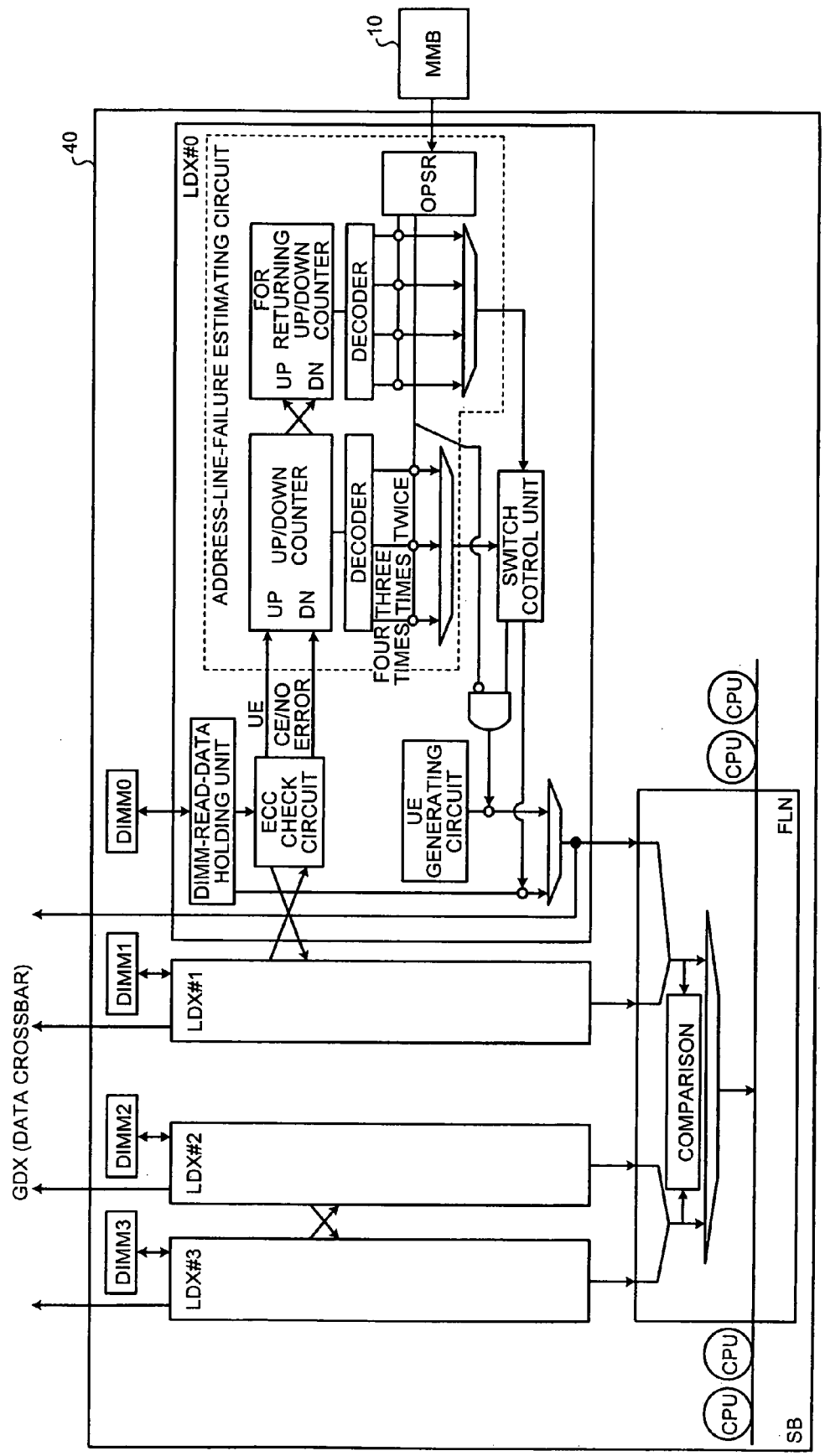
FIG. 8 is a block diagram of a system board and a memory controller according to a third embodiment of the present invention.

FIG. 8 is a block diagram of the system board and the memory controller according to the third embodiment. The configuration of the SB and the memory controller according to the third embodiment is fundamentally the same as the configuration of the SB and the memory controller according to the second embodiment except the following description.

The address-line-failure estimating circuit includes a counter, Decoder, OPSR, and a returning counter.

The OPSR receives setting from the MMB 10, estimates that an error does not occur on an address line, and designates a counter value to make the switch control unit switch error data to a part of original request data for return.

When the address-line-failure estimating circuit estimates that an error occurs on an address line, the ECC check circuit performs error rechecking through ECC, counts the number of times of no error, and outputs it to the Decoder.

When the address-line-failure estimating circuit determines whether the counter value output from the Decoder exceeds the upper-limit number of times designated from the OPSR. As a result of the determination, when the counter value exceeds the upper-limit number of times, the address-line-failure estimating circuit outputs a signal, to the switch control unit, to switch error data to a part of original request data for return. The upper-limit number of times can be altered by receiving change of setting from the MMB 10.

When the switch control unit receives a signal from the address-line-failure estimating circuit, the switch control unit controls to switch error data to request data for return. More specifically, the switch control unit outputs a signal to the UE generating circuit to switch error data to a part of original request data.

The determination result, by the address-line-failure estimating circuit, of whether the number of times when no error occurs exceeds the upper-limit number of times is not limited to when it is controlled that error data is switched to a part of original request data, for example, when the number of times when no errors continuously occur is counted and the number of times when no errors continuously occur exceeds the upper-limit number of times, the address-line-failure estimating circuit estimates that an error does not occur on an address line and can makes the switch control unit control to switch error data to a part of original request data.

Figure 9:
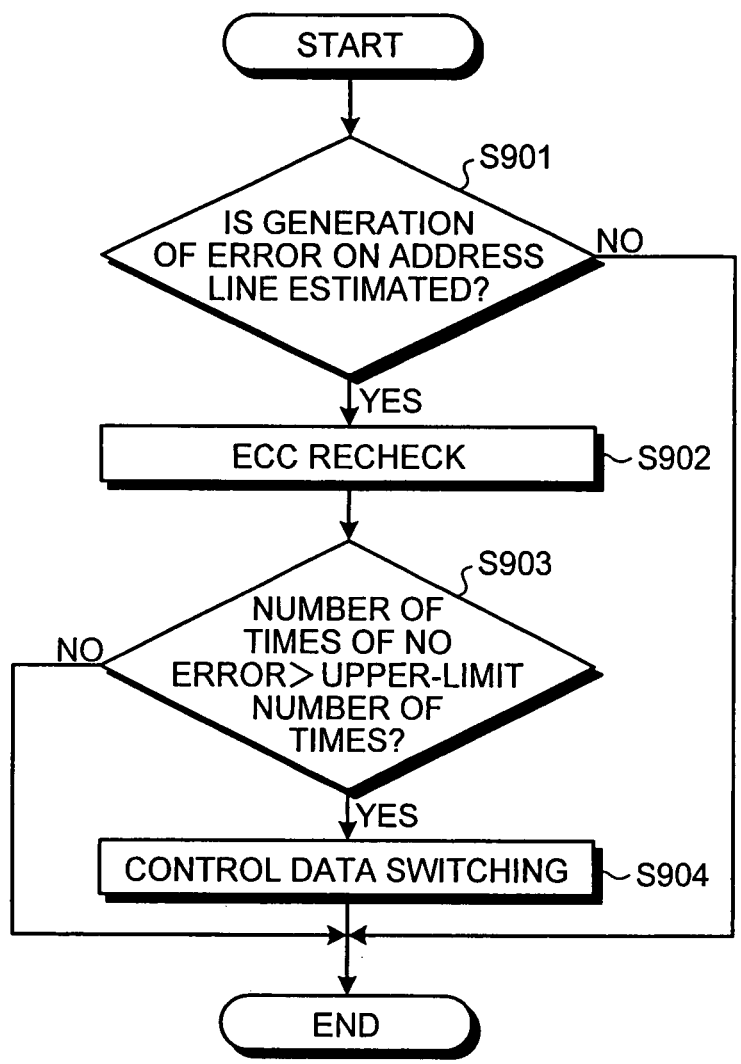
FIG. 9 is a flowchart for explaining processing of the memory controller according to the third embodiment.

FIG. 9 is a flowchart for explaining processing of the memory controller according to the third embodiment. Processing after the address line failure circuit estimates that an error occurs on an address line and request data is switched to error data is explained in the following.

As shown in FIG. 9, when the address-line-failure estimating circuit estimates that an error occurs on an address line (yes at step S901), error checking is performed again through ECC (step S902), the number of times of no errors is counted, and it is output to the Decoder.

The address-line-failure estimating circuit determines whether the counter value output from the Decoder exceeds the upper-limit number of times designated from the OPSR (step S903). As a result of the determination, when the counter value exceeds the upper-limit number of times (yes at step S903), the address-line-failure estimating circuit outputs a signal to the switch control unit to switch error data to a part of original request data for return. On the other hand, the address-line-failure estimating circuit does not particularly output a signal to the switch control unit when the counter value does not exceed the upper-limit number of times (no at step S903).

The switch control unit, when a signal is input from the address-line-failure estimating circuit, controls to switch error data to request data for return (step S905). More specifically, the switch control unit outputs a signal to the UE generating circuit to switch error data to a part of original request data.

As described above, according to the third embodiment, when it is estimated that an error occurs on an address line, error checking is performed again and it is determined that an error does not occur on an address line based on the resulting error checking that is performed again. When it is determined that an error does not occur on an address line, generated error data is switched to data associated with request and control is performed to resume using data of one line of redundant memory. Accordingly, estimation of an error on an address line allows prevention of a system down as well as, for example, in consideration of a possibility of causing a temporary error due to not an error on an address line but a failure of a part of a cell in the DIMM, improvement of a cell failure, if any, enables possible avoidance of lowering reliability because of single DIMM.

Furthermore, according to the third embodiment, the number of times of no errors obtained as the result of error checking that is performed again is counted and, when the number of times exceeds the predetermined upper-limit number of times, it is determined that an error does not occur on an address line. Thus, it is possible to avoid reliability lowering to the utmost because of single DIMM based on a simple configuration.

Moreover, according to the third embodiment, the predetermined upper-limit number of times to determine that an error does not occur on an address line is altered. For example, a system maintainer arbitrarily sets the upper-limit number of times so that it is possible to avoid reliability t lowering because of single DIMM to the utmost.

So far, exemplary embodiments of the present invention are explained, however, the present invention can be made based on various aspects except the above-mentioned embodiments. Therefore, embodiments that are included in the present invention are explained below.

In the above embodiments, one DIMM connected to the LDX is explained, however, the present invention is not limited to the case of a single DIMM, and a plurality of DIMMs can be connected to the LDX.

Figure 10:
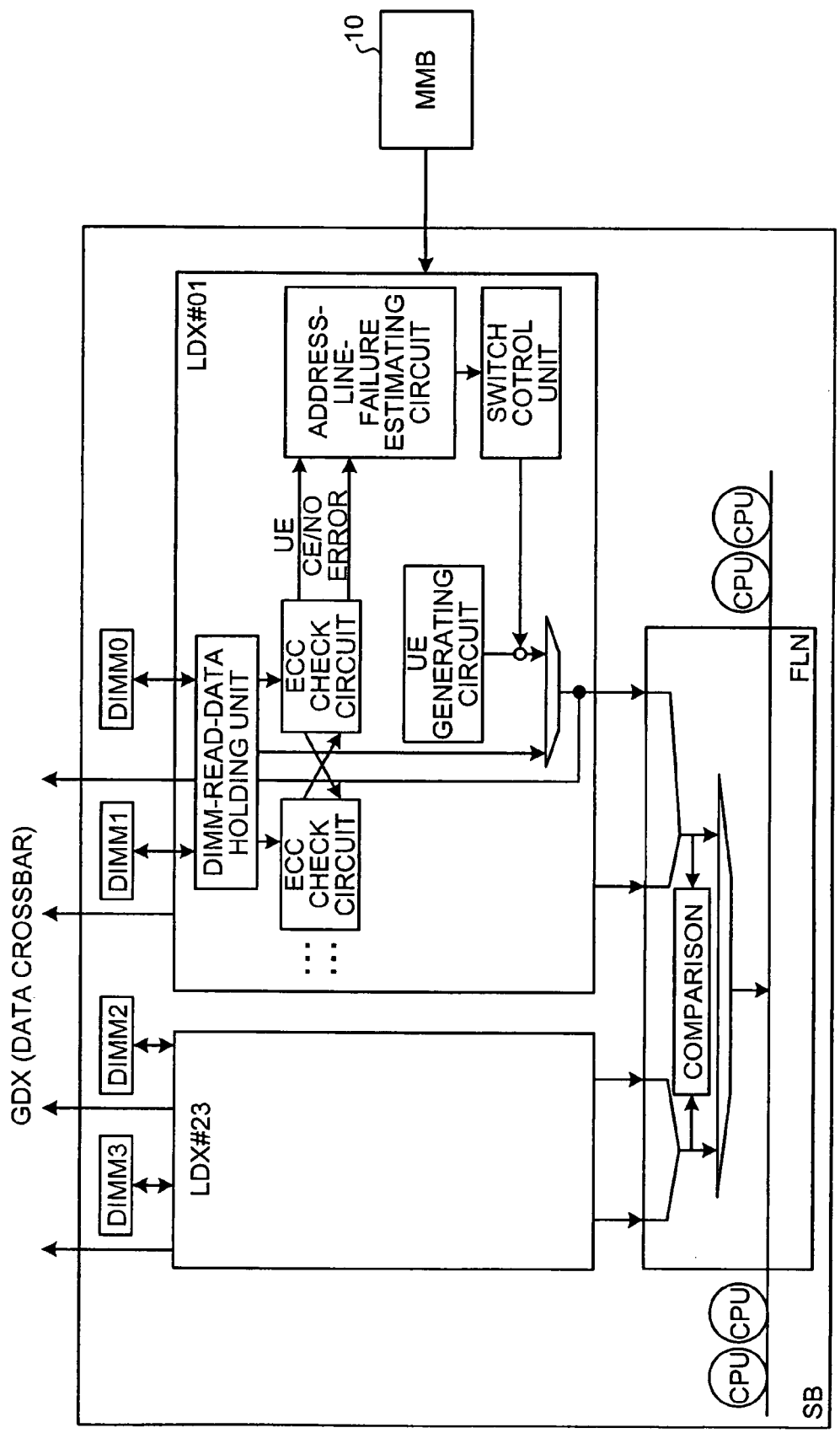
FIGS. 10 and 11 are schematics for explaining a configuration of a system board according to a fourth embodiment of the present invention.

For example, as shown in FIG. 10, two DIMMS, DIMM1 and DIMM0, are connected to the LDX#01, and the DIMM1 and the DIMM0 constitute a data unit. To estimate an error on an address line, the LDX#01 has the DIMM1 and the DIMM0 arranged with the ECC check circuit respectively that constitutes an error checking unit.

Based on the result of error checking that is performed with regard to a plurality of connected memories, it is estimated whether an error occurs on an address line. A system configuration of controlling two DIMMs through one memory controller, for example, allows estimation of an error on an address line, thereby enabling prevention of a system down.

Figure 11:
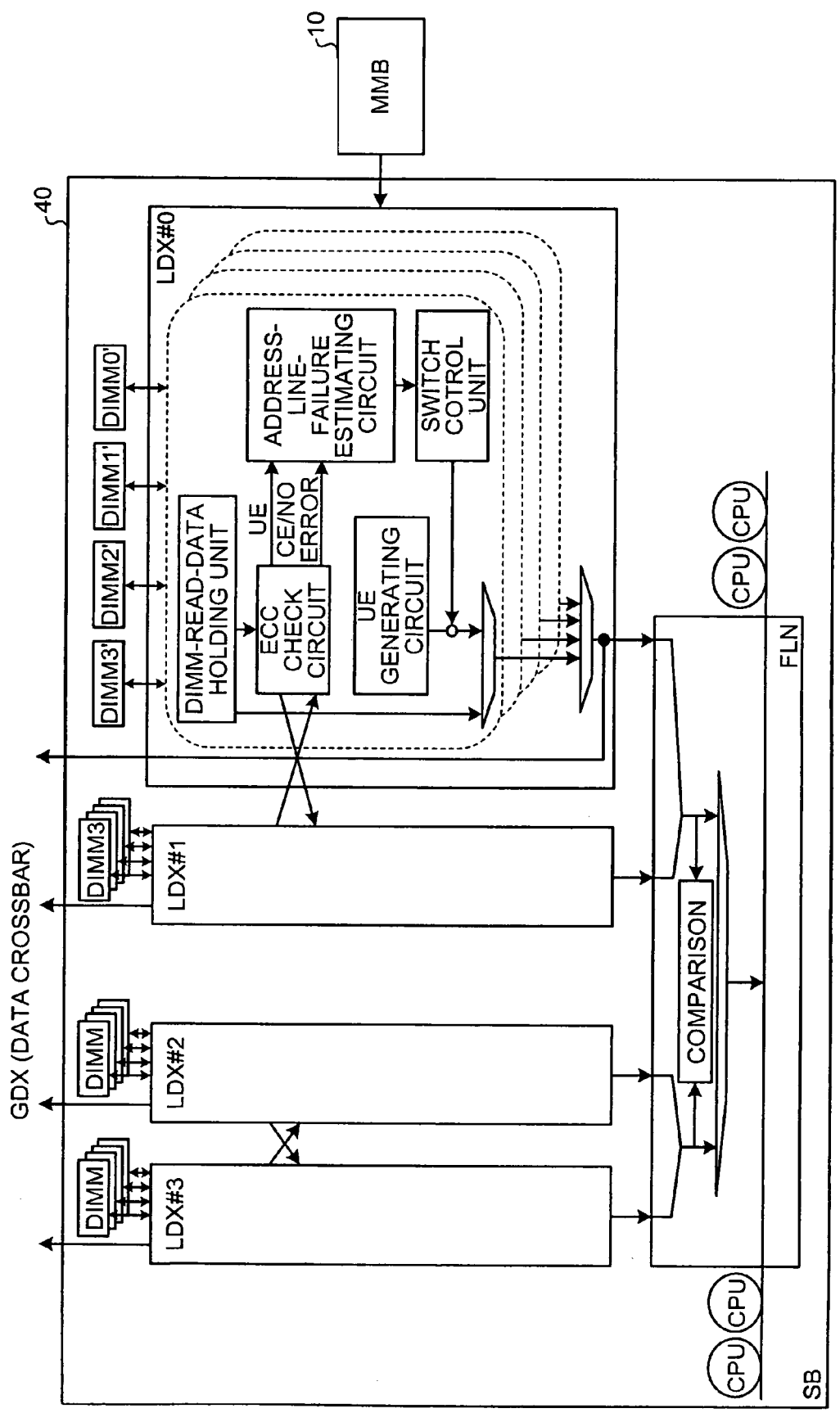

As shown in FIG. 11, four DIMMs are connected to the LDX#0 to #3 respectively. For example, the DIMM3 and a DIMM3' constitute a data unit. The LDX#1 connected to the DIMM3 and the LDX#0 connected to the DIMM3' include the ECC check circuit that constitutes an ECC check unit that is an error checking unit respectively. Likewise of the above embodiments, each ECC checking circuit exchanges its own ECC information (information for ECC checking) to perform ECC checking.

As such, based on the result of error checking that is performed with regard to each of a plurality of connected memories, it is estimated whether an error occurs on an address line. A system configuration of controlling four DIMMs through one memory controller, for example, allows estimation of an error on an address line while controlling single DIMM to the minimum, thereby enabling prevention of a system down.

For example, each component of the memory controller (LDX#0) shown in FIG. 3 has a conceptual function and does not always physically have a configuration as illustrated in the drawing. That is, specific aspects of distributing and integrating the memory controller are not limited to its illustration. For example, the ECC check circuit and the address-line-failure estimating circuit are integrated. Based on various loads or a using condition, the whole or a part of it can be functionally or physically distributed/integrated in an arbitrary unit for configuration.

Each processing capability (address line failure estimating processing capability, data switching processing capability, and memory data returning determination processing capability) that is performed in the memory controller (LDX) described in the above embodiments can be realized by the MMB 10 reading and implementing a program stored in predetermined memory prepared in advance.

As describe above, according to one aspect of the present invention, based on a resulting error checking of data associated with a request when there is a request in a system (for example, an error condition of data or a condition of the number of times when an error occurs), when whether an error occurs on an address line (a line that transmits a data address of a request) is estimated and it is estimated that an error occurs on an address line, error data is created with respect to data of the request to switch the data to error data, thereby controlling not to use data of one line of redundant memory. It is possible to deal with trouble information, in real time, such as information of estimating that an error occurs on an address line in the redundant memory system (mirror) and, if error data is caused due to an error on an address line, to switch to generated error data not to compare before comparing data at a comparison circuit in the redundant memory system (mirror). Thus, estimation of an error on an address line enables prevention of a system down.

Furthermore, according to another aspect of the present invention, based on a result of error checking that is performed with regard to a plurality of connected memories, it is estimated whether an error occurs on an address line. A system configuration of controlling two DIMMs through one memory controller, for example, allows estimation of an error on an address line, thereby enabling prevention of a system down.

Moreover, according to still another aspect of the present invention, based on a result of error checking that is performed with regard to connected memory, it is estimated whether an error occurs on an address line. A system configuration of controlling one DIMM through one memory controller has a higher capability than a system configuration of controlling two DIMMs through one memory controller, for example, thereby enabling prevention of a system down through estimation of an error on an address line.

Furthermore, according to still another aspect of the present invention, based on a result of error checking that is performed with regard to a plurality of connected memories, respectively, it is estimated whether an error occurs on an address line. A system configuration of controlling four DIMMs through one memory controller, for example, allows estimation of an error on an address line while controlling single DIMM to the minimum, thereby enabling prevention of a system down.

Moreover, according to still another aspect of the present invention, when the number of times when uncorrectable errors occur obtained as a resulting error checking is calculated and the number of times when uncorrectable errors occur exceeds the predetermined upper-limit number of times, it is estimated that an error occurs on an address line. Thus, it is possible to estimate an error on an address line by a simple configuration and prevent a system down.

Furthermore, according to still another aspect of the present invention, the predetermined upper-limit number of times to estimate that an error occurs on an address line is altered. For example, a system maintainer arbitrarily sets the upper-limit number of times so that it is possible to prevent a system down.

Moreover, according to still another aspect of the present invention, when it is estimated that an error occurs on an address line, error checking is performed again and it is determined that an error does not occur on an address line based on the resulting error checking that is performed again. When it is determined that an error does not occur on an address line, generated error data is switched to data associated with a request to control to resume using data of one line of redundant memory. Accordingly, estimation of an error on an address line allows prevention of a system down as well as, for example, in consideration of a possibility of causing a temporary error due to not an error on an address line but a failure of a part of a cell in a DIMM, improvement of a cell failure, if any, enables possible avoidance of reliability lowering because of a single DIMM.

Furthermore, according to still another aspect of the present invention, when the number of times of no error obtained as a resulting error checking that is performed again is counted and the number of times exceeds the predetermined upper-limit number of times, it is determined that an error does not occur on an address line. Thus, it is possible to avoid reliability lowering to the utmost because of a single DIMM based on a simple configuration.

Moreover, according to still another aspect of the present invention, the predetermined upper-limit number of times to determine that an error does not occur on an address line is altered. For example, a system maintainer arbitrarily sets the upper-limit number of times so that it is possible to avoid reliability lowering to the utmost because of a single DIMM.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A memory controller that controls a plurality of memories, the memory controller comprising:
   an estimating unit that counts a number of occurrences of uncorrectable errors obtained as a result of an error checking when there is a request for data, the memory controller controlling the plurality of memories each of which is a dual memory having an independent address line, the dual memory not recognizing an occurrence of an error on the address line, the estimating unit estimating an error has occurred on the independent address line for data related to the request when the number of occurrences of the uncorrectable errors exceeds a first predetermined threshold; and
   a control unit that generates error data when it is estimated that an error has occurred on the independent address line and disables one independent address line of the dual memory by switching the data output from the memory controller from data related to the request to the generated error data.

2. The memory controller according to claim 1, wherein the estimating unit estimates whether an error has occurred on the independent address line based on a result of an error checking executed for the memory connected to the memory controller.

3. The memory controller according to claim 1, wherein the estimating unit estimates whether an error has occurred on the independent address line based on a result of an error checking executed for each of a plurality of connected memories.

4. The memory controller according to claim 1, further comprising a determining unit that re-executes, when it is estimated that an error has occurred on the independent address line, the error checking, and determines whether an error has occurred on the independent address line based on a result of the re-executed error checking, wherein
   the control unit switches, when it is determined that an error has not occurred on the independent address line based on the re-executed error checking, data output from the memory controller from the generated error data to the data related to the request, and controls the memory.

5. The memory controller according to claim 4, wherein the determining unit counts the number occurrences of no errors obtained as the result of the re-executed error checking, and determines that an error has not occurred on the independent address line when the number of occurrences of the no errors exceeds a second predetermined threshold.

6. A memory controller that controls a plurality of memories each of which is a dual memory having an independent address line, the memory controller comprising:
   an estimating unit that counts a number of occurrences of uncorrectable errors obtained as a result of an error checking when there is a request for data, the estimating unit estimating an error has occurred on the independent address line for data related to the request when the number of occurrences of the uncorrectable errors exceeds a first predetermined threshold;
   a control unit that generates error data when it is estimated that an error has occurred on the independent address line and disables one independent address line of the dual memory by switching the data output from the memory controller from data related to the request to the generated error data; and
   a changing unit that changes the first predetermined threshold.

7. A memory controller that controls a plurality of memories each of which is a dual memory having an independent address line, the memory controller comprising:

an estimating unit that counts a number of occurrences of uncorrectable errors obtained as a result of an error checking when there is a request for data, the estimating unit estimating an error has occurred on the independent address line for data related to the request when the number of occurrences of the uncorrectable errors exceeds a first predetermined threshold;

a control unit that generates error data when it is estimated that an error has occurred on the independent address line and disables one independent address line of the dual memory by switching the data output from the memory controller from data related to the request to the generated error data;

a determining unit that re-executes, when it is estimated that an error has occurred on the independent address line, the error checking, and determines whether an error has occurred on the independent address line based on a result of the re-executed error checking; and a changing unit that changes a second predetermined threshold, wherein the control unit switches, when it is determined that an error has not occurred on the independent address line based on the re-executed error checking, data output from the memory controller from the generated error data to the data related to the request, and controls the memory, and the determining unit counts the number occurrences of no errors obtained as the result of the re-executed error checking, and determines that an error has not occurred on the independent address line when the number of occurrences of the no errors exceeds the second predetermined threshold.

8. A method of controlling a plurality of memories in a system each of which is a dual memory having an independent address line, the method comprising:

counting a number of occurrences of uncorrectable errors obtained based on a result of an error checking when there is a request for data in the system, the dual memory not recognizing an occurrence of an error on the address line;

estimating the error has occurred on the independent address line for data related to the request when the number of occurrences of the uncorrectable errors exceeds a first predetermined threshold;

generating, when it is estimated that an error has occurred on the independent address line, error data of the data related to the request; and controlling the memory to disable data from one independent address line of the dual memory by switching the data to be output from data related to the request to the generated error data.

9. The method according to claim 8, wherein the estimating includes estimating whether an error has occurred on the independent address line based on a result of an error checking executed for each of dual memories.

10. The method according to claim 8, further comprising:

re-executing, when it is estimated that an error has occurred on the independent address line, the error checking;

determining whether an error has occurred on the independent address line based on a result of the re-executed error checking; and switching, when it is determined that an error has not occurred on the independent address line, data to be output from the generated error data to the data related to the request.

11. The method according to claim 10, wherein the determining includes counting the number occurrences of no errors obtained as the result of the re-executed error checking, and determining that an error has not occurred on the independent address line when the number of occurrences of the no errors exceeds a second predetermined threshold.

\* \* \* \* \*